United States Patent
Song

(10) Patent No.: US 7,687,820 B2
(45) Date of Patent: Mar. 30, 2010

(54) NITRIDE-BASED WHITE LIGHT EMITTING DEVICE AND MANUFACTURING METHOD THEREOF

(75) Inventor: June O Song, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 173 days.

(21) Appl. No.: 11/503,291

(22) Filed: Aug. 11, 2006

(65) Prior Publication Data

US 2007/0034857 A1 Feb. 15, 2007

(30) Foreign Application Priority Data

Aug. 14, 2005 (KR) .............. 10-2005-0074593

(51) Int. Cl.
*H01L 33/00* (2006.01)
(52) U.S. Cl. ............... 257/99; 257/98; 257/E33.028; 257/E33.034; 257/E33.064
(58) Field of Classification Search ............... 257/99
See application file for complete search history.

(56) References Cited

U.S. PATENT DOCUMENTS

| 7,271,423 B2 * | 9/2007 | Hanamoto et al. ............ 257/98 |
| 7,341,878 B2 * | 3/2008 | Krames et al. ............... 438/22 |
| 2002/0063301 A1 * | 5/2002 | Hanamoto et al. .......... 257/432 |
| 2005/0260122 A1 * | 11/2005 | Li et al. ................. 423/594.14 |
| 2008/0121919 A1 * | 5/2008 | Krames et al. ............... 257/98 |

FOREIGN PATENT DOCUMENTS

JP 408236275 A * 9/1996 ............... 257/103

* cited by examiner

*Primary Examiner*—Jerome Jackson, Jr.
(74) *Attorney, Agent, or Firm*—Cantor Colburn LLP

(57) ABSTRACT

A light emitting device includes an n-type cladding layer, a p-type cladding layer, an active layer interposed between the n-type cladding layer and the p-type cladding layer and an ohmic contact layer contacting the p-type cladding layer or the n-type cladding layer. The ohmic contact layer includes a first film that includes a transparent conductive zinc oxide doped with a rare earth metal and including a one-dimensional nano structure. The one-dimensional nano structure is one of a nano-column, a nano rod and a nano wire.

12 Claims, 7 Drawing Sheets

NITRIDE-BASED WHITE LIGHT EMITTING DEVICE AND MANUFACTURING METHOD THEREOF

This Application claims priority to Korean patent application number 10-2005-0074593, filed on Aug. 14, 2005 and all the benefits accruing therefrom under 35 U.S.C. §119, and the contents of which in its entirety are herein incorporated by reference.

BACKGROUND OF THE INVENTION (a) Field of the Invention

The present invention relates to a white light emitting device and a manufacturing method thereof, and, in particular, to a top-emission nitride-based white light emitting device and a manufacturing method thereof.

(b) Description of the Related Art

Generally, a top-emission nitride-based light emitting device includes a p-type nitride-based cladding layer, an n-type nitride-based cladding layer, and a nitride-based active layer interposed therebetween. In the nitride-based light emitting device, light generated in the active layer passes through the n-type or p-type cladding layer and is emitted.

The p-type nitride-based cladding layer has a low hole concentration to have high sheet resistance. In order to compensate for the high sheet resistance, a thin ohmic contact layer including a nickel (Ni) thin film and a gold (Au) thin film is suggested to be employed.

However, when the light passes through the p-type cladding layer, the light emitting device has low emission efficiency due to the poor transmittance of the Ni—Au thin films and is thermally unstable due to the small thickness of the Ni—Au thin films.

Therefore, transparent conductive oxides such as indium-tin oxide (ITO) and zinc oxide (ZnO) are introduced as the material of the ohmic contact layer.

However, ITO or ZnO forms a schottky contact at an interface to cause great voltage drop and has large sheet resistance such that the operating voltage of the light emitting device is increased.

In the meantime, a structure for emitting light through the n-type nitride-based cladding layer is suggested. The structure includes a reflective p-type ohmic contact layer under the active layer and an n-type ohmic contact layer along with an electrode pad having a small contact area on the active layer so that the emission efficiency may be increased and heat generated during the operation of the light emitting device may be easily dissipated. However, the surface of the n-type nitride-based cladding layer in the above-described light emitting device may be apt to be oxidized due to the heat generated during the operation of the light emitting device, thereby degrading the reliability of the light emitting device. Accordingly, transparent conductive materials that are hardly oxidized are introduced as the material of the ohmic contact layer for the n-type nitride-based cladding layer.

Examples of transparent conductive materials include transparent conductive oxides such as ITO, $In_2O_3$, $SnO_2$, and ZnO and transparent conductive nitrides such as titanium nitride (TiN).

However, when the above-described transparent conductive oxides and nitrides are deposited by processes including chemical vapor deposition ("CVD") and physical vapor deposition such as sputtering, electron beam deposition and thermal deposition, deposited thin films have large sheet resistance. In addition, the transparent conductive oxides and nitrides have workfunction that is small and difficult to be adjusted, thereby forming high contact barrier and resistance.

Moreover, the transparent conductive thin films have high reflectance and absorbance for the light generated in the active layer and have refractive indices higher than air and two-dimensional flat interfaces, thereby further decreasing the emission efficiency of the light emitting device.

In the meantime, a nitride-based light emitting device emitting white light may include a light emitting member emitting ultraviolet light, near ultraviolet light, blue light, or green light and a phosphor, or may include a plurality of laminated light emitting members. However, the phosphor may cause environmental pollution and heat generation and may absorb significant amount of light to decrease the efficiency of the light emitting device. In addition, the lamination of light emitting members for manufacturing a light emitting device having high efficiency may be difficult.

BRIEF SUMMARY OF THE INVENTION

An exemplary embodiment of a white light emitting device according to the present invention includes an n-type cladding layer, a p-type cladding layer, an active layer interposed between the n-type cladding layer and the p-type cladding layer and an ohmic contact layer contacting the p-type cladding layer or the n-type cladding layer. The ohmic contact layer includes a first film that includes a transparent conductive zinc oxide doped with a rare earth metal and having a one-dimensional nano structure. The one-dimensional nano structure is one of a nano-column, a nano rod, and a nano wire.

In an exemplary embodiment, the one rare earth metal may include Er, Sm, Ce, Pr, Pm, Eu, Gd, Th, Dy, Ho, Tm, Yb, Lu, Th, Pa, U, Np, Pu, Am, Bk, Cf, Es, Fm, Md, No, Lr, and Cm An amount of the rare earth metal may be equal to or smaller than about 20 weight %.

In an exemplary embodiment, the n-type cladding layer, the p-type cladding layer, and the active layer may include nitrogen. The n-type cladding layer, the p-type cladding layer, and the active layer may include a group III nitride-based compound such as a compound having $Al_xIn_yGa_zN$, where x, y and z are integers.

In an exemplary embodiment, the first film further may include an additional ingredient including one of aluminum (Al), chromium (Cr), silicon (Si), germanium (Ge), indium (In), lithium (Li), gallium (Ga), magnesium (Mg), zinc (Zn), beryllium (Be), molybdenum (Mo), vanadium (V), copper (Cu), iridium (Ir), rhodium (Rh), ruthenium (Ru), tungsten (W), cobalt (Co), nickel (Ni), manganese (Mn), titanium (Ti), tantalum (Ta), cadmium (Cd), lanthanum (La), and oxides thereof. An amount of the additional ingredient may be from about 0.1 weight % to about 49 weight %.

In an exemplary embodiment, the first film may have a thickness equal to or greater than about five nanometers.

In an exemplary embodiment, the ohmic contact layer may further include a second film disposed between the first film and the p-type cladding layer or the n-type cladding layer. The second film may include a metal including Ni, Pd, Pt, Rh, Zn, In, Sn, Zn, Ag, and Au, transparent conductive oxides including ITO, $SnO_2$, ZnO, $In_2O_3$, $Ga_2O_3$, $RhO_2$, NiO, CoO, PdO, PtO, $CuAlO_2$, CdO, and $CuGaO_2$, and transparent conductive nitrides including TiN, TaN, and SiNx.

In an exemplary embodiment, the white light emitting device may further include a first electrode pad contacting the ohmic contact layer and a second electrode pad electrically connected to the p-type cladding layer or the n-type cladding layer and disconnected from the first electrode pad.

In an exemplary embodiment, the white light emitting device may further include a substrate, a bonding layer disposed on the substrate, a reflective layer disposed on the bonding layer and disposed under the p-type cladding layer or the n-type cladding layer and an electrode pad contacting the ohmic contact layer.

An exemplary embodiment of a method of manufacturing a white light emitting device includes forming an n-type cladding layer, an active layer, and a p-type cladding layer on a substrate, forming a transparent conductive zinc oxide film of an ohmic contact layer, the zinc oxide film doped with a rare earth metal and having a nano structure and heat treating the zinc oxide film.

In an exemplary embodiment, the rare earth metal may include one of Er, Sm, Ce, Pr, Pm, Eu, Gd, Th, Dy, Ho, Tm, Yb, Lu, Th, Pa, U, Np, Pu, Am, Bk, Cf, Es, Fm, Md, No, Lr, and Cm. An amount of the rare earth metal may be equal to or smaller than about 20 weight %.

In an exemplary embodiment, the formation of the zinc oxide film may include depositing a two-dimensional thin film of zinc oxide, and etching and re-growing the two-dimensional thin film under an atmosphere including a hydrogen gas.

In an exemplary embodiment, the zinc oxide film may include one of aluminum (Al), chromium (Cr), silicon (Si), germanium (Ge), indium (In), lithium (Li), gallium (Ga), magnesium (Mg), zinc (Zn), beryllium (Be), molybdenum (Mo), vanadium (V), copper (Cu), iridium (Ir), rhodium (Rh), ruthenium (Ru), tungsten (W), cobalt (Co), nickel (Ni), manganese (Mn), titanium (Ti), tantalum (Ta), cadmium (Cd), lanthanum (La), and oxides thereof.

In an exemplary embodiment, the method may further include forming an ohmic interlayer under the zinc oxide film. The ohmic interlayer may include a metal including Ni, Pd, Pt, Rh, Zn, In, Sn, Ag, Au, Cd, Mg, Be, Mo, V, Cu, Ti, Ir, Ru, W, Co, Mn, and La, transparent conductive oxides including ITO, $SnO_2$, ZnO, $In_2O_3$, $Ga_2O_3$, $RhO_2$, NiO, CoO, PdO, PtO, $CuAlO_2$, CdO, and $CuGaO_2$, and transparent conductive nitrides including TiN, TaN, and SiNx.

In an exemplary embodiment, the method may further include performing heat treatment after the formation of the ohmic interlayer and before the formation of the zinc oxide film. The heat treatment before the formation of the zinc oxide film may be performed at a temperature equal to or lower than about 800° C. and under a vacuum or under an atmosphere of oxygen ($O_2$), nitrogen ($N_2$), argon (Ar), hydrogen ($H_2$), or air.

DETAILED DESCRIPTION OF THE INVENTION

Figure 1:
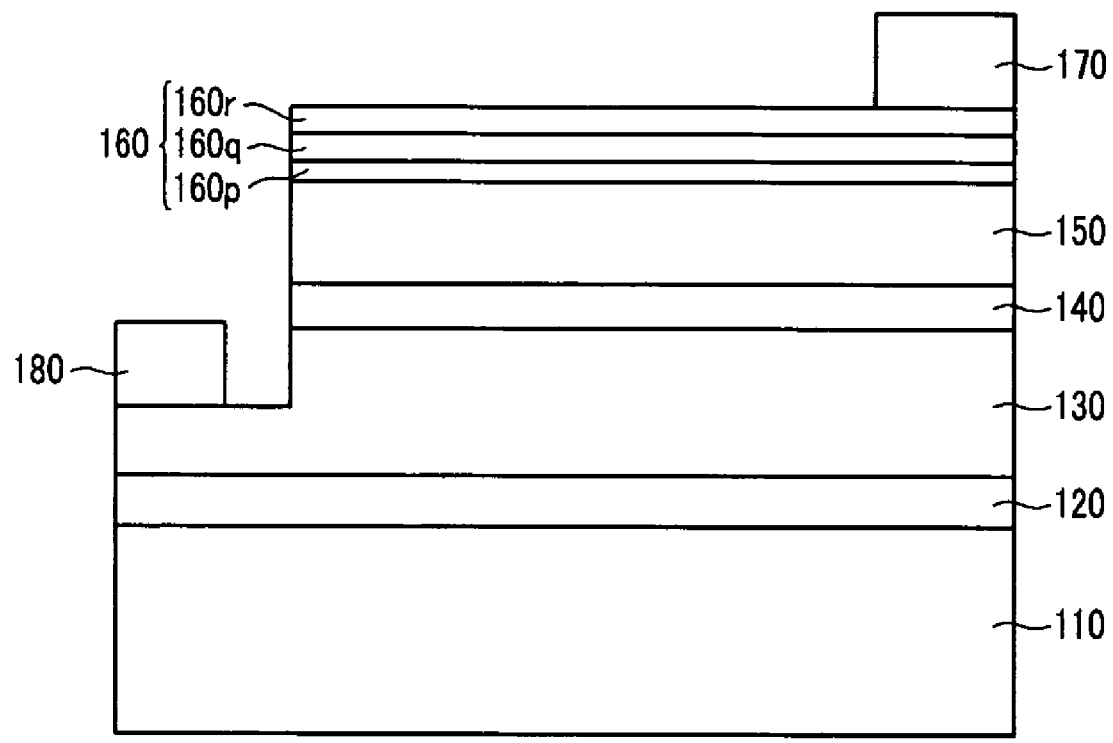
FIG. 1 is a sectional view of an exemplary embodiment of a top-emission nitride-based white light emitting device having a mesa structure according to the present invention.

The present invention now will be described more fully hereinafter with reference to the accompanying drawings, in which preferred embodiments of the invention are shown. The present invention may, however, be embodied in many different forms and should not be construed as limited to the embodiments set forth herein. In the drawings, the thickness of layers, films, panels, regions, etc. are exaggerated for clarity. Like numerals refer to like elements throughout. It will be understood that when an element such as a layer, film, region or substrate is referred to as being "on" another element, it can be directly on the other element or intervening elements may also be present. In contrast, when an element is referred to as being "directly on" another element, there are no intervening elements present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "lower," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected.

Thus, embodiments of the invention should not be construed as limited to the particular shapes of regions illustrated herein but are to include deviations in shapes that result, for example, from manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be described in detail with reference to the accompanying drawings.

Now, exemplary embodiments of white light emitting devices according to the present invention are described in detail with reference to FIG. 1, FIG. 2, FIG. 3 and FIG. 4.

FIG. 1 is a sectional view of an exemplary embodiment of a top-emission nitride-based white light emitting device having a mesa structure according to the present invention.

Referring to FIG. 1, a nitride-based buffer layer 120, an n-type nitride-based cladding layer 130, a nitride-based active layer 140, a p-type nitride-based cladding layer 150, and an ohmic contact layer 160 are sequentially formed on a substrate 110. A p-type electrode pad 170 is formed at a side of the ohmic contact layer 160. An n-type electrode pad 180 is formed on a side on the n-type cladding layer 130 and is disconnected from the p-type electrode pad 170.

In an exemplary embodiment, the substrate 110 may be made of an insulating material such as sapphire ($Al_2O_3$), and the nitride-based buffer layer 120 may be omitted.

In exemplary embodiments, each layer from the buffer layer 120 to the p-type cladding layer 150 includes a group III nitride-based compound, e.g., a compound having $Al_xIn_yGa_zN$ (where x, y and z are integers). In one exemplary embodiment, the n-type cladding layer 130 may further include an n-type dopant as well as the group III nitride-based compound and the p-type cladding layer 150 may further include a p-type dopant as well as the group III nitride-based compound. The active layer 140 generates light and may be single crystalline. The active layer 140 may have a single-layer structure or a multi-quantum well ("MQW") structure.

In one exemplary embodiment, when employing a gallium nitride (GaN) compound, the nitride-based buffer layer 120 may be made of GaN, and the n-type cladding layer 130 may be made of GaN doped with n-type dopant such as Si, Ge, Se or Te. The active layer 140 may have a MQW structure of InGaN and GaN or a MQW structure of AlGaN and GaN The p-type cladding layer 150 may be made of GaN doped with p-type dopant such as Mg, Zn, Ca, Sr or Ba.

Referring to FIG. 1, the n-type cladding layer 130 includes a thick portion and a thin portion taken in a direction perpendicular to the substrate 100. The active layer 140, the p-type cladding layer 150 and the ohmic contact layer 160 are disposed on the thick portion of the n-type cladding layer 130, and the n-type electrode pad 180 on the thin portion thereof.

This structure can be obtained by sequentially depositing the n-type cladding layer 130, the active layer 140, the p-type cladding layer 150 and the ohmic contact layer 160 and then removing a portion of these layers, such as by etching them.

In an exemplary embodiment, an n-type ohmic contact layer (not shown) may be interposed between the n-type cladding layer 130, such as on the thin portion of the n-type cladding layer 130, and the n-type electrode pad 180. In one exemplary embodiment, the n-type ohmic contact layer may have various structures, e.g. a sequentially deposited structure of a titanium thin film and an aluminum thin film.

In an exemplary embodiment, the p-type electrode pad 170 may have a sequentially deposited structure of a Ni thin film and an Au thin film, or of an Ag thin film and an Au thin film.

The ohmic contact layer 160 includes a lower film 160$p$, an intermediate film 160$q$, and an upper film 160$r$. In an alternative embodiment, one of the lower film 160$p$ and the intermediate film 160$q$ may be omitted.

In an exemplary embodiment, the upper film 160$r$ includes a one-dimensional nano structure such as nano-columns, nano-rods, or nano-wires. In addition, the upper film 160$r$ may have a two-dimensional lattice structure.

In exemplary embodiments, the upper film 160$r$ may be made of a transparent conductive zinc oxide (ZnO) doped with a rare earth metal. The rare earth metal may include, but is not limited to, Er, Sm, Ce, Pr, Pm, Eu, Gd, Th, Dy, Ho, Tm, Yb, Lu, Th, Pa, U, Np, Pu, Am, Bk, Cf, Es, Fm, Md, No, Lr, and Cm. In one exemplary embodiment, the amount of the rare earth metal may be equal to or lower than 20 weight percent (wt %).

In exemplary embodiments where the upper film 160$r$ may only include zinc, oxide, and at least one rare metal, the upper film 160$r$ may further include an additional ingredient for adjusting electron concentration, energy bandgap, or refractive index of the zinc oxide. The additional ingredient may be a metal or an oxide thereof including, but not limited to, aluminum (Al), chromium (Cr), silicon (Si), germanium (Ge), indium (In), lithium (Li), gallium (Ga), magnesium (Mg), zinc (Zn), beryllium (Be), molybdenum (Mo), vanadium (V), copper (Cu), iridium (Ir), rhodium (Rh), ruthenium (Ru), tungsten (W), cobalt (Co), nickel (Ni), manganese (Mn), titanium (Ti), tantalum (Ta), cadmium (Cd), and lanthanum (La). That is, the upper film 160$r$ may include at least one of the above-listed metals and oxides thereof as the additional ingredients.

In an exemplary embodiment, the amount of the additional ingredient may be from about 0.1 weight % to about 49 weight %.

In an exemplary embodiment, the thickness of the upper film 160$r$ may be equal to or greater than about 5 nanometers (nm). In one exemplary embodiment, the thickness of the upper film 160$r$ may be equal to or greater than about 10 nanometers.

In an exemplary embodiment, the upper film 160$r$ may be directly grown to have the one-dimensional nano structure. In an alternative embodiment, the upper film 160$r$ may be formed by depositing a two-dimensional thin film of zinc oxide and by etching and re-growing the two-dimensional thin film with heat treatment under an atmosphere including hydrogen gas ($H_2$).

In an exemplary embodiment, the lower film 160$p$ and the intermediate film 160$q$ may be an ohmic interlayer for improving the ohmic contact characteristic between the p-type nitride-based cladding layer 150 and the upper film 160$r$.

In exemplary embodiments, the lower film 160p and/or the intermediate film 160q may be made of a metal including, but not limited to, Ni, Pd, Pt, Rh, Zn, In, Sn, Ag, Au, Cd, Mg, Be, Mo, V, Cu, Ti, Ir, Ru, W, Co, and Mn, transparent conductive oxides including ITO, $SnO_2$, ZnO, $In_2O_3$, $Ga_2O_3$, $RhO_2$, NiO, CoO, PdO, PtO, $CuAlO_2$, CdO, and $CuGaO_2$, and transparent conductive nitrides including TiN, TaN, and SiNx.

In an exemplary embodiment of a method of forming the ohmic contact layer 160, after the lower film 160p and the intermediate film 160q are deposited, and before or after the upper film 160r is deposited, heat treatment may be performed at a temperature equal to or lower than about 800° C. and under a vacuum or under an atmosphere of various gases such as oxygen ($O_2$), nitrogen ($N_2$), argon (Ar), hydrogen ($H_2$), or air. The heat treatment may improve light transmittance and conductivity of the ohmic contact layer 160. Furthermore, plasma treatment may be performed by using ions of such as oxygen ($O_2$), nitrogen ($N_2$), hydrogen ($H_2$), or argon (Ar) for improving optical and electrical characteristics of the upper film 160r.

In an exemplary embodiment, each layer may be formed by chemical vapor deposition ("CVD") or physical vapor deposition ("PVD").

The CVD may include, but is not limited to, metalorganic chemical vapor deposition ("MOCVD").

The PVD may include, but is not limited to, evaporation, laser deposition, and sputtering. The evaporation includes, but is not limited to, thermal evaporation and electron beam evaporation. The laser deposition may include, but it not limited to, a laser beam having high energy. The sputtering may include, but is not limited to, ions of oxygen ($O_2$), nitrogen ($N_2$), or argon (Ar), and the sputtering may use two or more sputtering guns, which is referred to as co-sputtering.

The active layer 140 of the white light emitting device may emit ultraviolet light, near ultraviolet light, blue light, or green light. The ohmic contact layer 160 containing the rare earth metal can adjust the wavelength of the light emitted by the active layer 140, supplies charge carriers to the active layer 140, and spreads the current. Since the ohmic contact layer 160 is transparent, the luminous efficiency of the light emitting device increases.

In the light emitting device shown in FIG. 1, the light generated in the active layer 140 passes through the p-type cladding layer 150 and is emitted Advantageously, the light emitting device may be used for small emitting area, low capacity, and low luminance.

Figure 2:
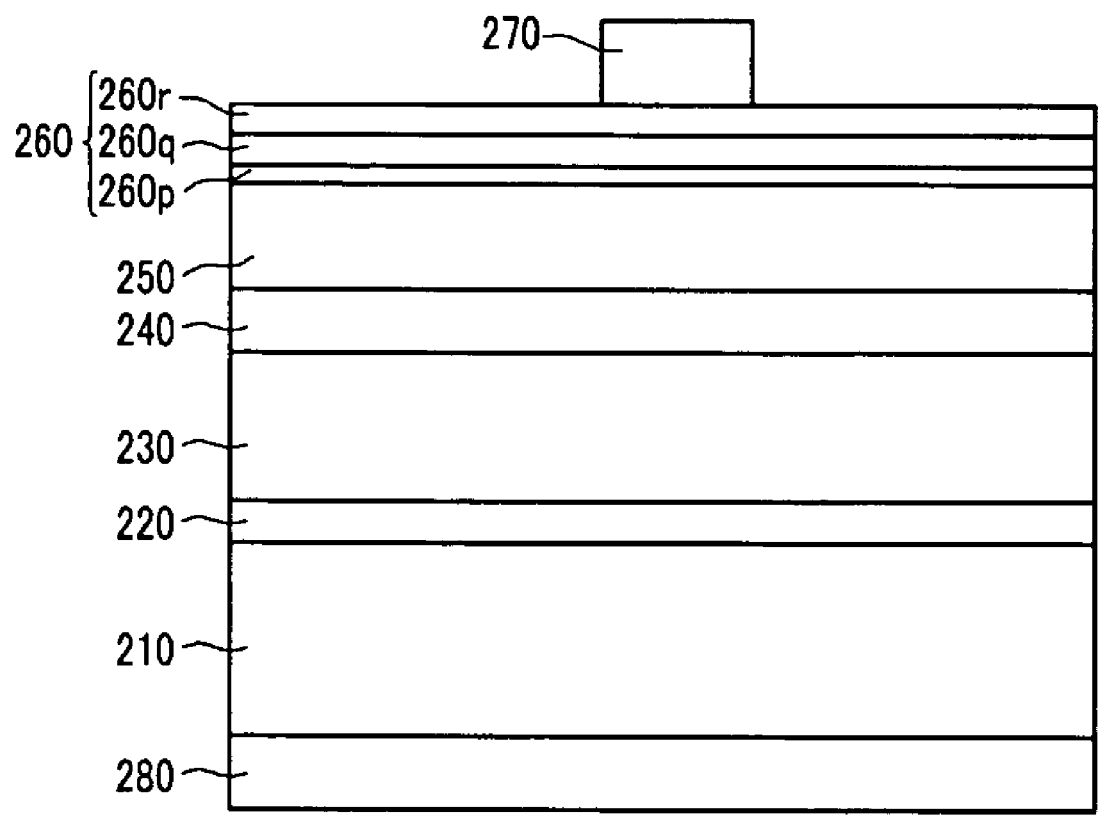
FIG. 2 is a sectional view of an exemplary embodiment of a top-emission nitride-based white light emitting device having a vertical structure according to the present invention.

FIG. 2 is a sectional view of an exemplary embodiment of a top-emission nitride-based white light emitting device having a vertical structure according to the present invention.

The layered structure of a light emitting device shown in FIG. 2 is similar to that shown in FIG. 1.

That is, a nitride-based buffer layer 220, an n-type nitride-based cladding layer 230, a nitride-based active layer 240, a p-type nitride-based cladding layer 250, and an ohmic contact layer 260 are sequentially formed on a substrate 210. The ohmic contact layer 260 includes a lower film 260p, an intermediate film 260q, and an upper film 260r.

Unlike the light emitting device shown in FIG. 1, the substrate 210 of the light emitting device shown in FIG. 2 may be made of conductive silicon carbide (SiC). An n-type electrode pad 280 is disposed opposite to the buffer layer 220 with respect to the substrate 210 and covers an entire surface of the substrate 210. A p-type electrode pad 270 is formed on the ohmic contact layer 260 and may be disposed substantially near the middle of the ohmic contact layer 260.

In an exemplary embodiment, the n-type electrode pad 280 is an ohmic electrode pad and may be made of a metal including, but not limited to, rhodium, or silver having high reflectance. The n-type electrode pad 280 may have various layered structures.

The n-type cladding layer 230 has a substantially uniform thickness and thus no etching may be needed.

Since the light emitting device shown in FIG. 2 use the conductive substrate 210, heat is effectively dissipated from the light emitting device. Advantageously, the light emitting device may be used for large area, large capacity, and high luminance.

Many features of the light emitting device shown in FIG. 1 may be applicable to the light emitting device shown in FIG. 2.

Figure 3:
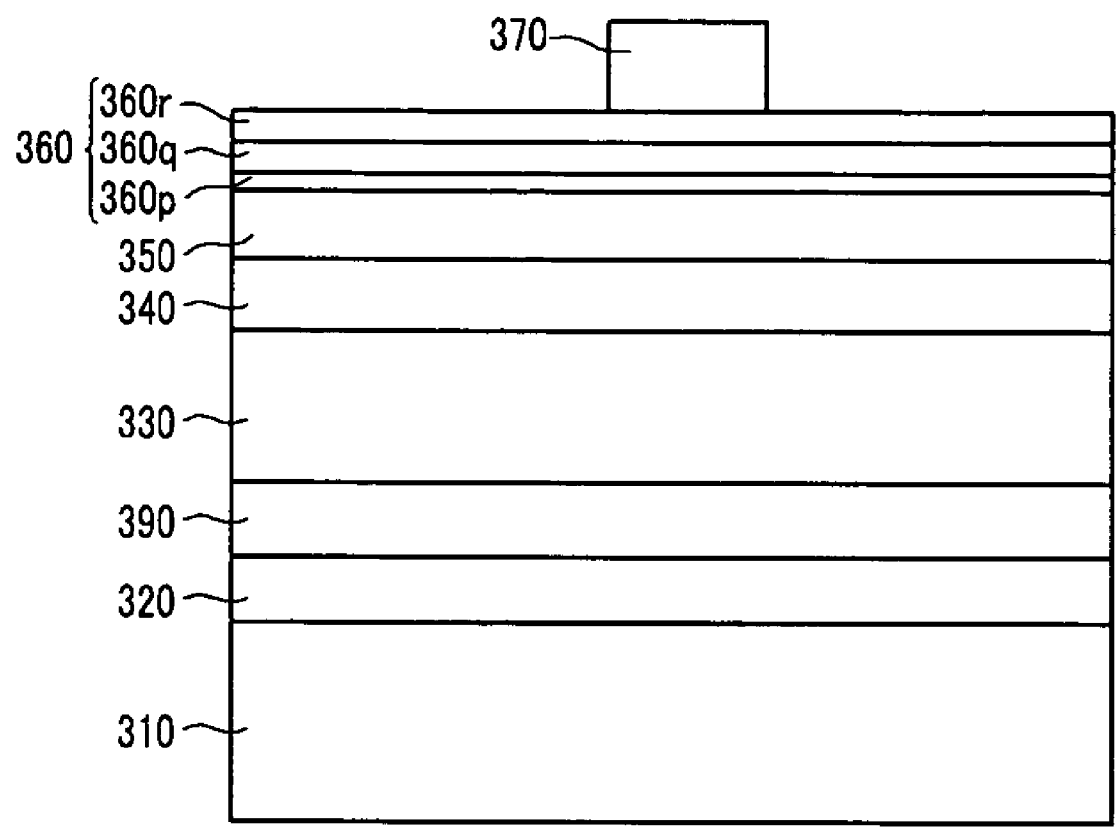
FIG. 3 is a sectional view of another exemplary embodiment of a top-emission nitride-based white light emitting device having a vertical structure according to the present invention.

FIG. 3 is a sectional view of another exemplary embodiment of a top-emission nitride-based white light emitting device having a vertical structure according to the present invention.

The layered structure of a light emitting device shown in FIG. 3 is similar to that shown in FIG. 2.

That is, an n-type nitride-based cladding layer 330, a nitride-based active layer 340, a p-type nitride-based cladding layer 350, an ohmic contact layer 360, and a p-type electrode pad 370 are sequentially formed on a substrate 310. The ohmic contact layer 360 includes a lower film 360p, an intermediate film 360q, and an upper film 360r.

Unlike the light emitting device shown in FIG. 2, the light emitting device shown in FIG. 3 includes no n-type electrode pad, and includes a bonding layer 320 instead of the buffer layer. The substrate 310 may be made of a conductive semiconductor, a metal, etc.

A reflective layer 390 is formed between the bonding layer 320 and the n-type cladding layer 330 and the reflective layer 390 reflects the light from the active layer 340.

In an exemplary embodiment of manufacturing the light emitting device shown in FIG. 3, a structure including at least one of the reflective layer 390, the n-type nitride-based cladding layer 330, the nitride-based active layer 340, the p-type nitride-based cladding layer 350, the ohmic contact layer 360, and the p-type electrode pad 370 is formed on an insulation substrate (not shown) made of sapphire, etc. The structure is separated from the insulation substrate, such as using laser lift off, and bonded onto the conductive substrate 310 via the bonding layer 320.

The light emitting device shown in FIG. 3 also has excellent heat dissipation and may advantageously used for large area, large capacity, and high luminance.

Many features of the light emitting device shown in FIG. 2 may be applicable to the light emitting device shown in FIG. 3.

Figure 4:
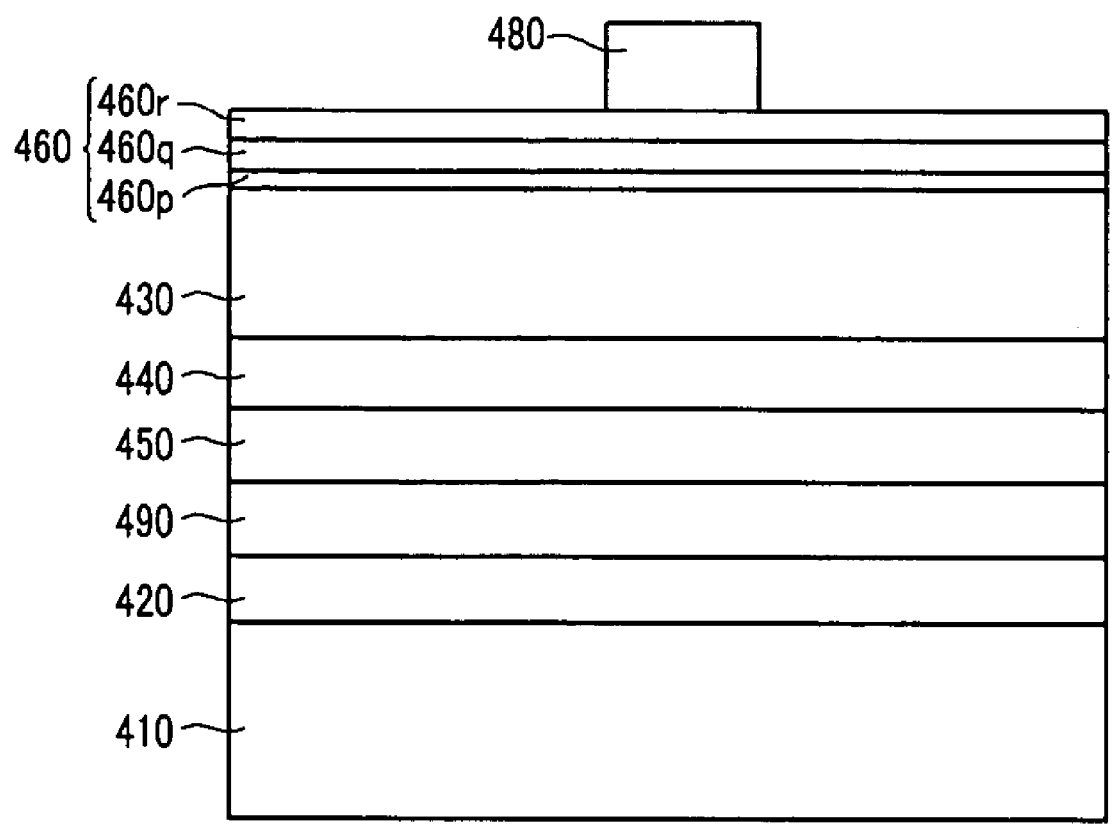
FIG. 4 is a sectional view of another exemplary embodiment of a top-emission nitride-based white light emitting device having a vertical structure according to the present invention.

FIG. 4 is a sectional view of another exemplary embodiment of a top-emission nitride-based white light emitting device having a vertical structure according to the present invention.

The layered structure of a light emitting device shown in FIG. 4 is similar to that shown in FIG. 3.

That is, a bonding layer 420 and a reflective layer 490 are sequentially formed on a substrate 410, and an n-type nitride-based cladding layer 430, a nitride-based active layer 440, a p-type nitride-based cladding layer 450, and an ohmic contact layer 460 are formed thereon. The ohmic contact layer 460 includes a lower film 460p, an intermediate film 460q, and an upper film 460r.

However, the relative positions of the n-type nitride-based cladding layer 430 and the p-type nitride-based cladding layer 450 in the light emitting device shown in FIG. 4 are exchanged as compared with those shown in FIG. 3. In addition, an n-type electrode pad 480 are formed instead of the p-type electrode pad 370.

Many features of the light emitting device shown in FIG. 3 may be applicable to the light emitting device shown in FIG. 4.

The white light emitting device as in the illustrated exemplary embodiment including the nano-structured ohmic contact layer improves the interface characteristic of the ohmic contact layer to show improved current-voltage characteristics and increases emission efficiency.

Figure 5A:
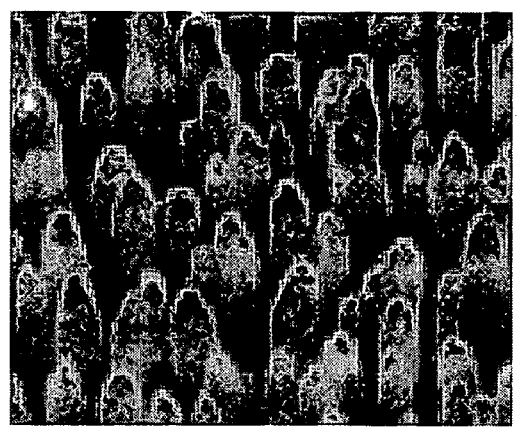
FIG. 5A, FIG. 5B, and FIG. 5C show exemplary embodiments of shapes of grown zinc oxides (ZnO) having one-dimensional nano structure for forming the ohmic contact layer shown in FIG. 1 to FIG. 4.
Figure 5B:
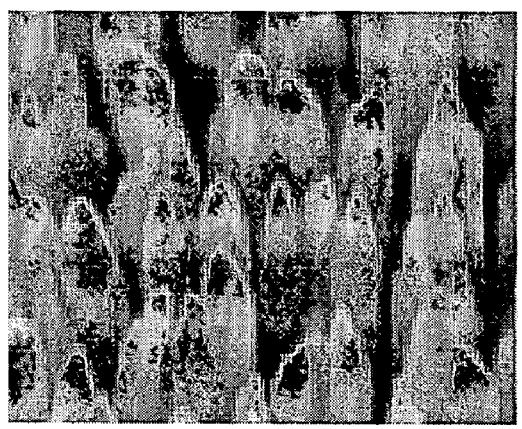
Figure 5C:
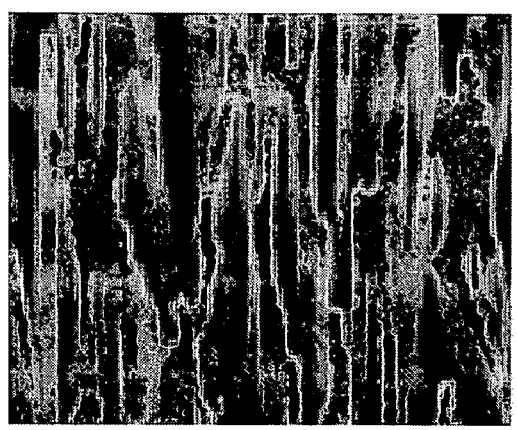

FIG. 5A, FIG. 5B, and FIG. 5C show exemplary embodiment of shapes of grown zinc oxides (ZnO) doped with a rare earth metal and having a one-dimensional nano structure for forming the ohmic contact layer shown in FIG. 1 to FIG. 4.

The zinc oxides doped with a rare earth metal shown in FIG. 5A, FIG. 5B, and FIG. 5C are formed under different process conditions, e.g., at different temperatures and for different process times.

FIG. 6A, FIG. 6B, FIG. 6C, and FIG. 6D show exemplary embodiments of various shapes made by etching zinc oxides (ZnO) doped with a rare earth metal to have one-dimensional nano structure for forming the ohmic contact layer shown in FIG. 1 to FIG. 4.

Figure 6A:
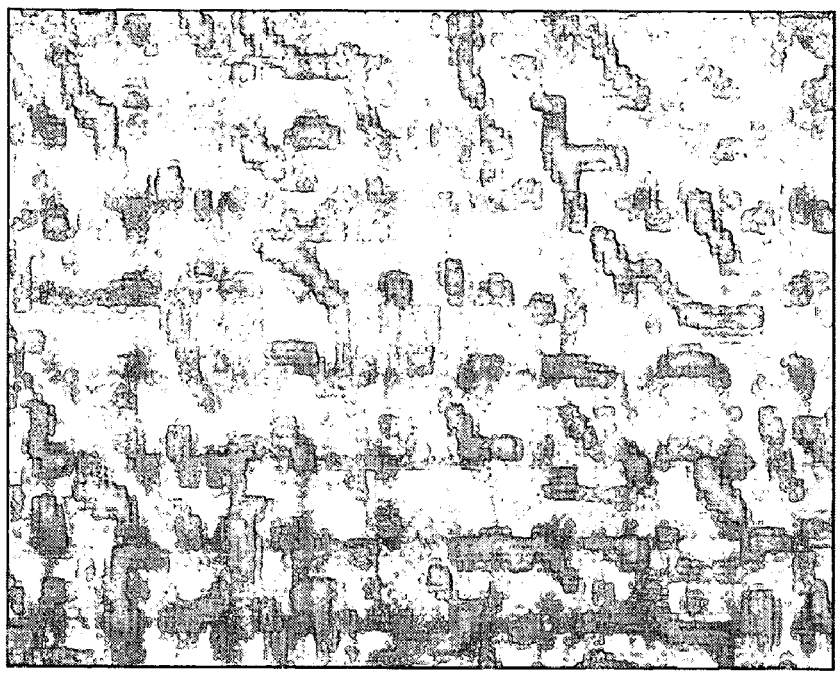
FIG. 6A, FIG. 6B, FIG. 6C, and FIG. 6D show exemplary embodiments of various shapes made by etching zinc oxides (ZnO) doped with a rare earth metal to have one-dimensional nano structure for forming the ohmic contact layer shown in FIG. 1 to FIG. 4.
Figure 6B:
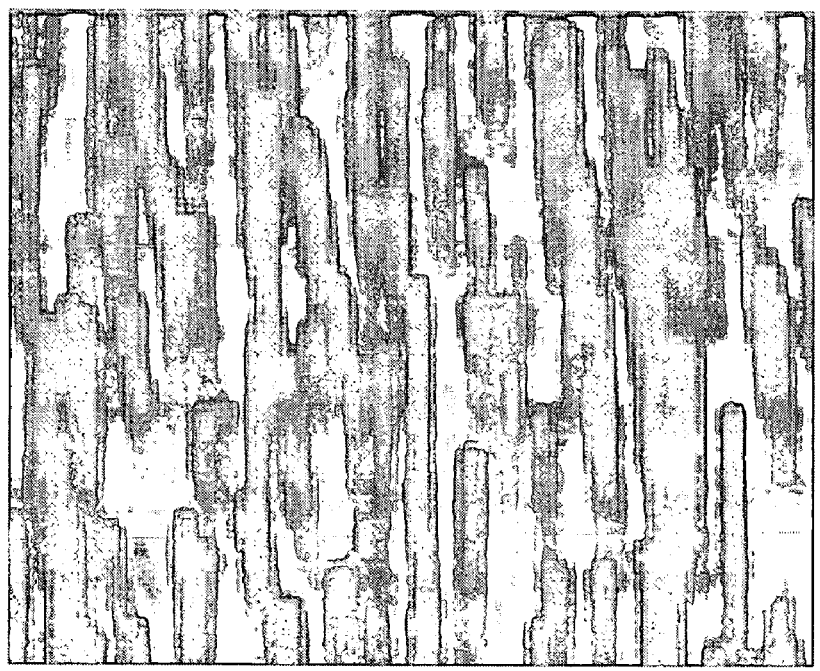
Figure 6C:
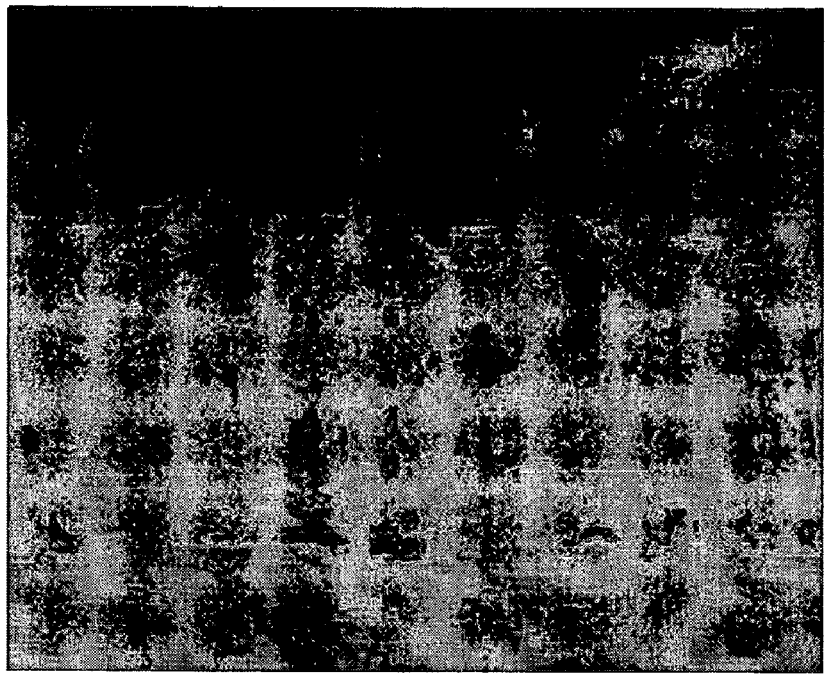
Figure 6D:
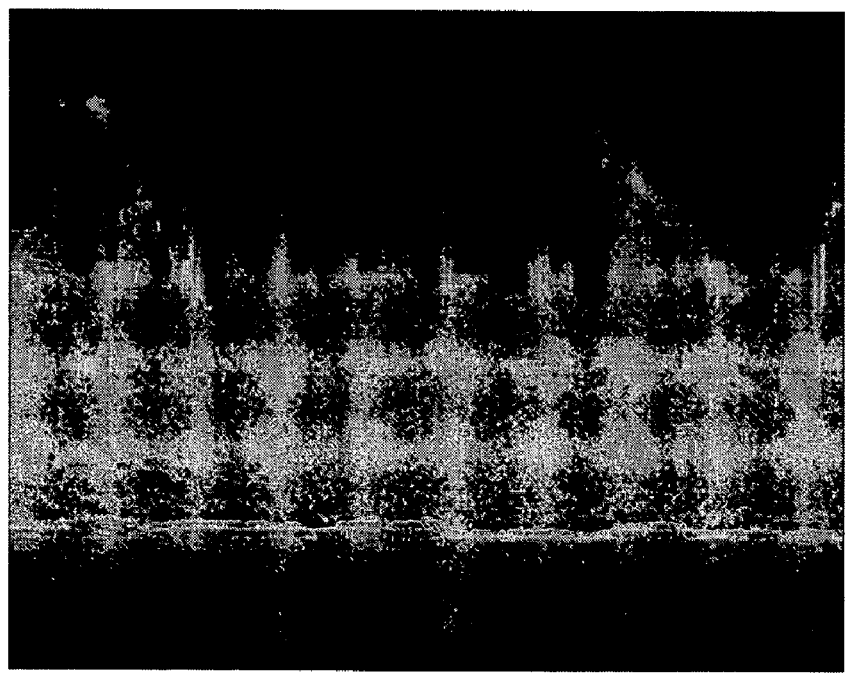

FIG. 6A shows a two-dimensional thin film formed by depositing zinc oxide (ZnO). FIG. 6B, FIG. 6C, and FIG. 6D show zinc oxides made by etching the zinc oxide thin film shown in FIG. 6A under an atmosphere of hydrogen gas or ions, which have slightly different shapes depending on the process temperature and the process time for the etching.

In order to improve the optical and electrical characteristics of the nano-structured zinc oxide, in one exemplary embodiment, the zinc oxide is subjected to plasma treatment using ions of oxygen ($O_2$), nitrogen ($N_2$), hydrogen ($H_2$), and at a temperature equal to or lower than about 800° C.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A white light emitting device comprising:
   an n-type cladding layer;
   a p-type cladding layer;
   an active layer interposed between the n-type cladding layer and the p-type cladding layer;
   an ohmic contact layer contacting the p-type cladding layer or the n-type cladding layer and comprising a first film comprising a transparent conductive zinc oxide doped with at least one rare earth metal and including a one-dimensional nano structure; and
   a first electrode pad contacting the ohmic contact layer,
   wherein the one-dimensional nano structure is one of a nano-column, a nano rod, and a nano wire.

2. The white light emitting device of claim 1, wherein the rare earth metal includes one of Er, Sm, Ce, Pr, Pm, Eu, Gd, Tb, Dy, Ho, Tm, Yb, Lu, Th, Pa, U, Np, Pu, Am, Bk, Cf, Es, Fm, Md, No, Lr, and Cm.

3. The white light emitting device of claim 2, wherein an amount of the rare earth metal is equal to or smaller than about 20 weight %.

4. The white light emitting device of claim 1, wherein the n-type cladding layer, the p-type cladding layer and the active layer comprise nitrogen.

5. The white light emitting device of claim 4, wherein the n-type cladding layer, the p-type cladding layer and the active layer comprise a group III nitride-based compound.

6. The white light emitting device of claim 5, wherein the n-type cladding layer, the p-type cladding layer and the active layer comprise a compound including $Al_xIn_yGa_zN$, where x, y and z are integers.

7. The white light emitting device of claim 1, wherein the first film further comprises an additional ingredient comprising one of aluminum (Al), chromium (Cr), silicon (Si), germanium (Ge), indium (In), lithium (Li), gallium (Ga), magnesium (Mg), zinc (Zn), beryllium (Be), molybdenum (Mo), vanadium (V), copper (Cu), iridium (Ir), rhodium (Rh), ruthenium (Ru), tungsten (W), cobalt (Co), nickel (Ni), manganese (Mn), titanium (Ti), tantalum (Ta), cadmium (Cd), lanthanum (La), and oxides thereof.

8. The white light emitting device of claim 7, wherein an amount of the additional ingredient is from about 0.1 weight % to about 49 weight %.

9. The white light emitting device of claim 1, wherein the first film has a thickness equal to or greater than about five nanometers.

10. The white light emitting device of claim 1, wherein the ohmic contact layer further comprises a second film disposed between the first film and the p-type cladding layer or the n-type cladding layer, the second film comprising one of metals including Ni, Pd, Pt, Rh, Zn, In, Sn, Zn, Ag, and Au, transparent conductive oxides including ITO, $SnO_2$, ZnO, $In_2O_3$, $Ga_2O_3$, $RhO_2$, NiO, CoO, PdO, PtO, $CuAlO_2$, CdO, and $CuGaO_2$, and transparent conductive nitrides including TiN, TaN, and SiNx.

11. The white light emitting device of claim 1, further comprising:
   a second electrode pad electrically connected to the p-type cladding layer or the n-type cladding layer and disconnected from the first electrode pad.

12. The white light emitting device of claim 1, further comprising:
   a substrate;
   a bonding layer disposed on the substrate;
   a reflective layer disposed on the bonding layer and disposed under the p-type cladding layer or the n-type cladding layer; and
   an electrode pad contacting the ohmic contact layer.

* * * * *